United States Patent
Backus et al.

(10) Patent No.: US 6,336,962 B1
(45) Date of Patent: Jan. 8, 2002

(54) METHOD AND SOLUTION FOR PRODUCING GOLD COATING

(75) Inventors: Petra Backus; Hartmut Mahlkow, both of Berlin; Christian Wunderlich, Velten, all of (DE)

(73) Assignee: Atotech Deutschland GmbH (DE)

( * ) Notice: Subject to any disclaimer, the term of this patent is extended or adjusted under 35 U.S.C. 154(b) by 0 days.

(21) Appl. No.: 09/529,139

(22) PCT Filed: Oct. 5, 1998

(86) PCT No.: PCT/DE98/03007

§ 371 Date: Jul. 7, 2000

§ 102(e) Date: Jul. 7, 2000

(87) PCT Pub. No.: WO99/18253

PCT Pub. Date: Apr. 15, 1999

(30) Foreign Application Priority Data

Oct. 8, 1997 (DE) .......................... 197 45 602

(51) Int. Cl.[7] .......................... C23C 18/31; B05D 1/18; C25D 3/48
(52) U.S. Cl. .................. 106/1.23; 106/1.26; 427/443.1; 427/437; 205/85; 205/181; 205/187; 205/265; 205/267; 205/271
(58) Field of Search ................ 106/1.23, 1.26; 427/437, 443.1; 205/85, 181, 187, 265, 267, 271

(56) References Cited

U.S. PATENT DOCUMENTS

| | | | | |
|---|---|---|---|---|
| 3,635,761 A | * | 1/1972 | Haag et al. ................. 106/1.23 |
| 3,915,814 A | * | 10/1975 | Greenspan .................. 205/176 |
| 3,929,595 A | * | 12/1975 | Biberbach et al. .......... 205/250 |
| 3,992,211 A | * | 11/1976 | Skoll ......................... 106/1.11 |
| 4,069,113 A | * | 1/1978 | Crossley et al. ............. 205/250 |
| 4,411,965 A | * | 10/1983 | Risegren et al. ............ 428/672 |
| 4,435,253 A | * | 3/1984 | Baker et al. ................. 205/248 |
| 4,615,774 A | * | 10/1986 | Somers et al. .............. 205/250 |
| 4,670,107 A | * | 6/1987 | Lochet ........................ 205/143 |
| 4,795,534 A | * | 1/1989 | Lochet ........................ 205/250 |
| 4,891,069 A | * | 1/1990 | Holtzman et al. .......... 106/1.22 |
| 4,980,035 A | * | 12/1990 | Emmengger ................ 205/238 |
| 5,202,151 A | | 4/1993 | Ushio .......................... 427/98 |
| 5,203,911 A | * | 4/1993 | Sricharoenchaikit et al. .... 106/1.26 |
| 5,206,055 A | | 4/1993 | Iacovangelo ............. 427/443.1 |
| 5,318,621 A | | 6/1994 | Krulik ........................ 106/1.23 |
| 5,364,460 A | | 11/1994 | Morimoto et al. .......... 106/1.23 |
| 5,470,381 A | | 11/1995 | Kato .......................... 106/1.23 |
| 6,183,545 B1 | * | 2/2001 | Okuhama et al. .......... 106/1.23 |

FOREIGN PATENT DOCUMENTS

| | | |
|---|---|---|
| DE | 42 02 842 | 1/1993 |
| GB | 872785 | 7/1961 |
| GB | 1022061 | 3/1966 |
| JP | 09 157859 | 10/1997 |
| WO | PCT/DE91/00498 | 6/1991 |
| WO | PCT/DE91/00624 | 8/1991 |

OTHER PUBLICATIONS

Derwent abstract of SU 1505986, Sep. 1989.*
Derwent abstract of RU 2036622, Jun. 1995.*

* cited by examiner

*Primary Examiner*—Helene Klemanski
(74) *Attorney, Agent, or Firm*—Paul & Paul

(57) ABSTRACT

The present invention describes a method of producing gold coating on a workpiece having a palladium surface, having the steps of:

a) making an aqueous solution containing at least one compound selected from the group of compounds containing gold(I) and gold(III) ions and additionally at least one organic compound selected from the group consisting of formic acid, aromatic carboxylic acids having the chemical formula:

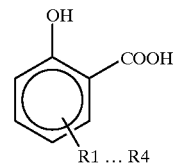

where R1, ..., R4=H, alkyl, alkenyl, alkynyl, OH, and the salts, esters or amides of these compounds;

b) adjusting the pH of the solution to 1 to 6 using pH adjusting agents; and c) bringing the workpiece into contact with the solution such that gold coating is plated onto the palladium surface.

8 Claims, No Drawings

METHOD AND SOLUTION FOR PRODUCING GOLD COATING

BACKGROUND OF THE INVENTION

Gold layers are used to produce solderable, gluable and bondable surfaces on circuitboards and other electronic components and to produce electric contacts. Such layers were originally produced by electrolytic methods. However, there are some major disadvantages to methods where electrolytic gold deposition can be used. In many cases, gold cannot be deposited electrolytically at all, because surfaces that electrically insulated from one another must be gold plated.

Therefore, electroless methods have been developed, whereby gold can be deposited from a suitable solution without external electric contacting. Baths used in such methods are used in particular in the production of high-grade circuitboards or circuit substrates for integrated circuits. The final layer required for the soldering process is usually formed from nickel or a nickel alloy deposited in an electroless operation and a thin layer of gold deposited on top of that. The gold layer is only 0.05 $\mu$m to 0.2 $\mu$m thick. Thinner layers cannot adequately protect the underlying nickel. On the other hand, thicker layers cannot be deposited without permanently damaging the nickel layers.

Solutions for electroless deposition processes contain reducing agents such as ascorbic acid, hydrazine, hydroxylamine, dimethylaminoborane, trimethylaminoborane or formaldehyde. Thiourea and its derivatives have also been proposed as reducing agents. These solutions contain complex gold compounds such as halogeno complexes, cyano complexes, thiosulfato complexes or sulfito complexes as the gold salts.

U.S. Pat. No. 5,202,151 describes a method of electroless deposition of gold, where gold(I) ion complexes of thiosulfate or sulfite are used together with thiourea, derivatives thereof or hydroquinone as the reducing agent. In addition, sulfite may also be added to the solution to stabilize it. The pH of the solution is in the range of 7 to 11. According to the specifications in this U.S. Patent, gold is deposited on nickel, cobalt and gold layers at a maximum rate of 1 $\mu$m/hour. It is mentioned that the deposition rate is too low at a pH lower than 7.

International Application WO-A 92/00398 describes a combination of aqueous baths for electroless deposition of gold. The precoating bath contains disulfitoaurate(I) complexes, an alkali or ammonium sulfite as stabilizer, a reducing agent and another complexing agent. The reducing agents are aldehydes, such as formaldehyde, or derivatives thereof, and ethylenediamine, for example, may be added as an additional complexing agent. A second bath contains, in addition to dicyanoaurate(I) complexes, cobalt(II) salts and thiourea. The gold layers are again deposited on nickel or nickel alloy surfaces. The precoating bath is adjusted to a maximum pH of 8.

U.S. Pat. No. 5,318,621 describes an electroless metal deposition solution for silver and gold, containing a noncyanide metal complex with thiosulfate, sulfite and ethylenediaminetetraacetic acid as the complexing agent and at least one amino acid to increase the deposition rate. Examples are given there for producing silver layers on copper surfaces coated with nickel layers. The solutions have a pH in the range of 7 to 9, preferably 7.5 to 8.5.

International Application WO-A 92/02663 describes a stable, electroless acid gold bath containing tetracyanogold (III) complexes, at least one complexing agent having carboxyl groups and phosphonic acid groups and an acid, where the pH of the solution is set to less than 1. The gold layers are deposited, for example, on layers of iron/nickel/cobalt alloys, nickel or tungsten surfaces at the rate of 0.2 to 0.5 $\mu$m in 30 minutes.

U.S. Pat. No. A 5,470,381 discloses an electroless gold deposition solution containing tetrachlorogold(III) complexes or gold(I) complexes with thiosulfate or sulfite as the complexing agent, plus ascorbic acid, a pH buffer and organic sulfur compounds to stabilize the solution to prevent spontaneous decomposition. The solution is adjusted to a pH of 5 to 9, preferably 6 to 8. The gold layers are applied to a substrate to which has been applied first a 3 $\mu$m thick layer of nickel and then a 3 $\mu$m thick layer of gold. The deposition rate is 0.6 to 1 $\mu$m/hour.

U.S. Pat. No. 5,364,460 describes another electroless gold deposition bath which contains a gold-sulfito complex and a reducing agent from the group of hydrazine, ascorbic acid, trimethylaminoborane and dimethylaminoborane. The solution also contains, for example, amino acids or aminobenzoic acid to increase the deposition rate. The pH of the solution is in the range of 6 to 11, preferably 7 to 9. The deposition rate is given as approximately 0.1 to about 5 $\mu$m/hour. It is stated that the deposition rate is too low when the pH is below 6. The layers are deposited on copper, nickel/boron or nickel/phosphorus layers on circuitboards or ceramic chip carriers.

One of the known deposition solutions contains, in addition to the gold salts, considerable quantities of reducing agent(s), such as ascorbic acid, boranes, hydrazines or formaldehyde. However, this causes the solutions to be susceptible to precipitation of metallic gold. There have been various attempts to improve the stability of the solutions against this spontaneous decomposition: for example, organic sulfur compounds have been added to the solution (U.S. Pat. No. 5,470,381) or nonionic surfactants or polymers have been used as stabilizers (U.S. Pat. No. 5,364,460).

However, it has been found that it is very difficult to stabilize the reductive gold baths. Even if no instability can be found by a test in which a precipitate of gold from the solution is tested, gold may nevertheless under some circumstances be deposited on surface areas that should not have a catalytic effect for gold deposition. In the production of finely structured electronic components in particular, this wild growth poses problems, so that even the slightest stability problems must be carefully prevented.

Therefore, baths containing no reducing agent have been developed. Such baths contain thiourea, for example, or a complexing agent such as ethylenediaminetetraacetic acid or salts thereof to accelerate the charge exchange of the gold ions with the less noble metal substrate. Most proposals have been for deposition of gold layers on nickel or nickel alloy surfaces.

Such a bath is described in British Patent Application No. 1,022,061. This bath contains a gold salt and ethylenediaminetetraacetic acid as a complexing agent and also, for example, nickel, cobalt or copper ions bound to salicylic acid, for example in a complex to permit deposition of thick gold layers. The pH of the bath is at least 6.5 and is therefore unsuitable for coating a substrate which is already coated with a photoresist or a screen printing resist. The gold layers are deposited on a nickel substrate.

Nickel is dissolved in deposition of gold. It is therefore very important to interrupt the gold deposition process after a certain amount of time to prevent excessive loss of nickel due to corrosion. In this case, the deposited gold layer could lose contact with the underlying gold layer, so that the gold layer would become delaminated. If delamination of gold occurs, the gold layer becomes worthless for any further processing, e.g., soldering operations.

For these reasons, the final layers of nickel or a nickel alloy and a layer of gold above it have been successful only for soldering applications and as a contact layer for ultrasonic bonding of integrated semiconductor circuits by the ultrasonic bonding technique. However, nickel/gold layers are not suitable for thermosonic bonding techniques, because the layer thickness that can be achieved is not sufficient. For this case, the above-mentioned electroless gold baths could be used, because thicker gold layers could also be produced with them. However, such baths have the disadvantages mentioned above. In some cases, these baths are also alkaline and therefore cannot be used for processing circuits with photoresists and screen printing resists.

Additional disadvantages have also been observed with the methods based on a charge exchange reaction. Even with seemingly intact layer combinations with layers of gold and nickel, it has been found in some very thorough studies that large areas of nickel layer remain unimpaired, whereas nickel in locally limited areas dissolves.

Therefore, at those locations where the nickel layer is attacked severely, no adhesive bond can be formed with the growing layer of gold. Especially in the production of high-grade fine-structured electronic components, this necessarily leads to total failure of the entire circuit, because such faults may be large enough to make the entire function area on the circuit useless. Although baths without a reducing agent have a greater bath stability, they are not suitable for use in the production of fine-structured electronic components.

SUMMARY OF THE INVENTION

Therefore, the object of the present invention is to prevent the disadvantages of the known methods and to find in particular a method and a chemical solution with which even extremely finely structured metal areas can be plated for electronic components, while safely avoiding gold plating areas that are not catalytic for gold deposition and without problems in dissolution of the metal substrate. Furthermore, it should also be possible to produce final layers that can be bonded by a thermosonic method on metal structures by the method according to this invention.

This problem is solved by a method and an aqueous solution according to the present invention.

DETAILED DESCRIPTION OF THE INVENTION

The principle of the method and the solution according to this invention are based on a catalytically controlled deposition of gold. This is made possible by deposition on palladium surfaces in particular, using in particular an aqueous deposition solution containing at least one compound from the group consisting of compounds containing gold(I) or gold(III) ions, at least one organic compound from the group consisting of formic acid, aromatic carboxylic acids having the chemical formula:

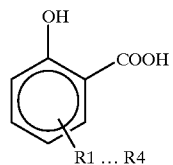

where R1, ... R4=H alkyl, alkenyl, alkynyl, OH as well as salts, esters or amides of these compounds. The pH of the solution is 1 to 6, preferably about 3 to 3.5. The aromatic carboxylic acids may also contain one or more R1 to R4 groups in addition to the carboxylic acid group and the ortho-position hydroxyl group. Salicylic acid is especially suitable as the aromatic carboxylic acid.

The concentration of the organic compounds according to this invention is preferably in the range of 0.001 to 5 mol/L and especially 0.005 to 0.3 mol/L.

The gold layers are preferably formed by bringing palladium surfaces to be coated in contact with the gold deposition solution. Palladium layers can be produced easily by electroless deposition.

This method has various advantages:

1. Gold is deposited exclusively on the palladium layers. This safely prevents deposition of gold on other surface areas of the workpiece.
2. Not only thin gold layers but also thicker gold layers can be deposited by using the organic compounds according to this invention from the group consisting of formic acid, aromatic carboxylic acids and salts, esters and amides of these compounds. It is assumed that these additives are catalytically destroyed on the palladium surfaces, thereby forming the reducing agent for the deposition of gold.
3. For the same reason, the deposition baths are very stable with respect to spontaneous decomposition, because only catalytically active palladium contributes to reduction of gold.
4. The deposition of gold is not interrupted by formation of 0.2 $\mu$m thick layers. Evidently even very small pores in the gold layer covering the palladium substrate are sufficient to permit further growth of the gold layer. Therefore, the deposition of gold comes to a standstill only at layer thicknesses above approximately 1 $\mu$m.
5. Even metal surfaces with extremely fine structuring can be gold plated, because the pH of the solution can be set in the acidic range, and therefore the plating solution will not attack even alkaline developing photoresists and screen printing resists. This has the advantage that it is not necessary to gold plate the entire surface of a circuitboard, for example. It is sufficient to merely gold plate the metal structures needed for a bonding or soldering process, preferably also coating the sides of the metal structures. It is sufficient to gold plate only the metal structures needed for a bonding or soldering process, preferably also coating the sides of the metal structures.

Gold layers with a thickness of 0.3 to 0.8 $\mu$m are deposited. Thicker layers may also be produced. However, they are not necessary for the applications mentioned. This would lead to excessively high costs.

Cyano complexes (salts of the anion $[Au(CN)_2]^-$) or sulfito complexes (salts of the anion $[Au(SO_3)_2]^{3-}$) may also be used as the gold(I) compounds. The preferred gold(III) compounds are also preferably cyano complexes (salts of the anion $[Au(CN)_4]^-$) or halogen complexes (salts of the anion $[AuX_4]^-$) and gold halides or gold cyanide $(AuX_3)$, where X denotes a halogen, preferably chlorine or CN. In addition, other compounds of gold may also be used, e.g., thiosulfato complexes.

The concentration of gold compounds is preferably in the range of 0.01 to 20 g/L, based on the gold content. An especially suitable solution contains the gold compounds in a concentration of approximately 2 g/L, based on the gold content.

The solution may also contain in addition at least one complexing agent for other metal ions, mainly heavy metal ions, e.g., nickel, cobalt, copper, tin, lead or palladium ions. Amino acids, e.g., β-alaninediacetic acid

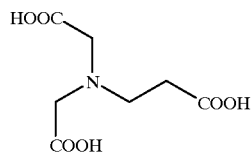

or the salts thereof are used as complexing agents. The carboxylic acids according to this invention and the salts thereof may optionally act as complexing agents for the above-mentioned heavy metal cations.

Mainly acids such as sulfuric acid or sulfonic acids may be used to adjust the pH of the solution. Methanesulfonic acid, benzenesulfonic acid, toluenesulfonic acid or phenolsulfonic acid may be used. Hydrochloric acid may also be used to adjust the pH, especially if a chloro complex of gold is used.

In addition to the above-mentioned bath components, the coating solution may also contain pH buffering substances, such as a citrate or acetate buffer. Furthermore, the gold solution may also contain other substances.

The temperature of the coating solution is set according to the selected bath composition. A temperature in the range of 65° C. to 95° C. has proven especially suitable.

Copper metal structures are usually used to produce electric circuits, e.g., of circuitboards or circuit substrates for semiconductor circuits, first coating them with palladium layers to form the gold layers by the method according to this invention.

The palladium layers may be formed by electrolytic or electroless deposition from a suitable coating solution. Preferably formaldehyde-free palladium baths are used for this purpose. Baths containing formic acid, the salts and/or esters thereof as the reducing agent are especially suitable. Such baths also contain a palladium salt and one or more nitrogen compounds as complexing agents. The pH of these baths is above 4, preferably in the range of 5 to 6. Any palladium compounds may be used as palladium salts, e.g., palladium chloride, palladium sulfate, palladium nitrate or palladium acetate. Examples of nitrogen-containing complexing agents include ethylenediamine, 1,3-diaminopropane, 1,2-bis-(3-aminopropylamino)-ethane, 2-diethylaminoethylamine and diethylenetriamine.

Other electroless palladium coating solutions may contain, in addition to a palladium compound, e.g. an amine or ammonia, a sulfur compound and hypophosphorous acid or the salts thereof as reducing agents.

The palladium layer is either deposited directly on layers containing nickel or cobalt produced by an electrolytic or electroless method, e.g., a nickel-boron or a cobalt-phosphorus alloy layer. If the surface is copper, the palladium layer may also be applied to a thin palladium layer formed by charge exchange.

Electrically non-conducting surfaces may be seeded with a conventional palladium catalyst and then palladium plated with an electroless palladium bath if they are to be provided with a final gold layer.

The coating with gold and optionally also with the other coating metals palladium, nickel, cobalt and copper may be performed in the usual immersion installations. Instead of an immersion process, however, it is also possible to use a coating method where the workpieces are brought in contact with the solutions by spray jets or nozzles or flood jets. A preferred method consists of passing circuitboards horizontally in a vertical or horizontal position through a treatment installation and applying the coating solutions to the circuitboard surfaces through successive spray jets or nozzles or flood jets.

Extremely finely structured circuit substrates with surface-mounted semiconductor circuits can be produced by the method according to this invention, with the circuits being bonded to the corresponding terminal sites on the circuit substrate by ball-wedge bonds. Such ball-wedge bonds can be produced by the thermosonic method.

The following examples are presented to further illustrate this invention:

EXAMPLE 1

A copper-laminated base material for circuitboards of epoxy resin/fiberglass cloth (FR4) was provided with another 30 μm-thick copper layer by electrolytic copper deposition from a conventional acid copper sulfate bath.

Then a layer combination of 5 μm nickel and then 5 μm gold was deposited electrolytically. The baths used for this purpose are the same as those used commercially. Then a 0.5 μm-thick palladium layer was applied from another bath for electroless palladium plating. The bath contained the following bath ingredients:

| palladium acetate | 0.05 mol/L |
|---|---|
| ethylenediamine | 0.1 mol/L |
| sodium formate | 0.2 mol/L |
| succinic acid | 0.15 mol/L |

The pH of the bath was set at 5.5 with formic acid. The bath temperature was 67° C.

Then the board was immersed in an aqueous solution having the following composition:

| sodium gold(I) cyanide | 3 g/L |
|---|---|
| sodium formate | 20 g/L |
| β-alaninediacetic acid | 20 g/L |
| pH | 3.5 |
| Temperature | 89° C. |

After one hour, a gold layer 0.6 μm thick had been deposited on the palladium, this layer adhered well to the substrate. In a test of the metal layers beneath the gold layer, it was found that the metal layers were unchanged and in particular they were not corroded.

EXAMPLE 2

Copper conductors on a circuitboard were provided with a 5 μm thick nickel-phosphorus layer by means of a conventional electroless coating bath. Then the nickel layers were coated with a 0.5 μm thick palladium layer. Next the circuitboard was immersed in an aqueous bath having the following composition for five minutes:

| sodium gold(I) cyanide | 2 g/L |
|---|---|
| salicylic acid | (solution saturated with salicylic acid) |
| β-alaninediacetic acid | 20 g/L |
| pH | 2.5 |
| temperature | 89° C. |

The surfaces of the conductors had a golden colored surface. The gold layer was 0.08 μm thick. In a cross-sectional analysis of the layer combination, no corrosion of the base metal layers could be discovered. Adhesion of the gold layer to the substrate was excellent.

EXAMPLE 3

A circuitboard was prepared as described in Example 2 and then immersed in an aqueous solution having the following composition:

|   |   |
|---|---|
| potassium gold(III) cyanide | 3 g/L |
| phenolsulfonic acid | 15 g/L |
| formic acid | 10 g/L |
| pH | 1 |
| temperature | 70° C. |

After a coating time of 20 minutes, a 0.37 μm thick gold layer was deposited, adhering very securely to the substrate. No corrosion of the base metals could be observed in metallographic cross-sectional analysis.

EXAMPLE 4

FR4 laminate with a resin surface roughened with conventional etchants was treated with a conventional palladium activator (adsorption of a Pd complex from an aqueous solution and then reducing the complex on the FR4 surface).

Then a 0.5 μm thick palladium layer was deposited. The laminate was then immersed for twenty minutes in a gold bath with the composition according to Example 2.

A 0.3 μm thick adhering gold layer was deposited.

EXAMPLE 5

A laminate pretreated according to Example 4 was coated with a 0.5 μm thick palladium layer. Then a 0.1 μm thick adhering gold layer was deposited by immersing the laminate in a bath having the following composition:

|   |   |
|---|---|
| gold(III) chloride | 1.5 g/L |
| sodium formate | 20 g/L |
| pH | 3.5 |
| temperature | 70° C. |

Comparative Example 1

Example 1 was repeated. However, only a nickel layer was deposited on the electrolytic copper layer, but no additional gold or palladium layer was deposited.

The gold layer was deposited on the nickel layer directly from the bath according to the present invention.

The adhesive strength of the gold layer was much worse than that according to Example 1, because the nickel layer was highly corroded and therefore the gold layer separated from the substrate in flakes.

Comparative Example 2

Example 1 was repeated, but the gold layer was deposited directly on the electrolytic copper layer without any other intermediate layers. The copper layer became severely corroded. The deposition of gold was inhibited by the dissolution of copper in the gold bath. The deposition rate quickly became slower until the process came to a standstill.

Comparative Example 3

Example 3 was repeated. However, instead of the composition given in Example 3 for the gold bath, a composition without any formic acid was selected.

No deposition of gold was observed.

All the features disclosed as well as combinations of the features disclosed are the object of this invention, unless explicitly stated as already known.

What is claimed is:

1. A method of producing gold coating on a workpiece having a palladium surface, comprising the steps of:
   a. making an aqueous solution containing
      i. at least one compound selected from the group consisting of compounds containing gold(I) or gold (III) ions, and
      ii. at least one organic compound selected from the group consisting of formic acid, aromatic carboxylic acids with the chemical formula

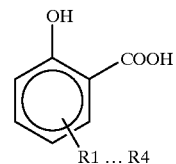

where R1, . . . , R4=H, alkyl, alkenyl, alkynyl, OH, and salts, esters or amides of these compounds;
   b. adjusting the pH of the solution to 1 to 6 with pH adjusting agents; and
   c. bringing the workpiece into contact with the solution wherein gold coating is plated onto the palladium surface.

2. The method according to claim 1, wherein the aromatic carboxylic acid is salicylic acid.

3. The method according to claim 1 or 2, wherein the pH of the solution is adjusted to 3 to 3.5.

4. The method according to claim 1 or 2, wherein the palladium surface is formed by electrolytic or electroless deposition of at least one palladium layer.

5. The method according to claim 4, wherein the at least one palladium layer is deposited on at least one layer containing electrolytic or electroless nickel or cobalt deposited on the workpiece.

6. The method according to claim 4, wherein the at least one palladium layer is deposited on at least one electrically nonconducting surface of the workpiece after prior activation.

7. The method according to claim 1 or 2, wherein at least one complexing agent for metal ions selected from the group consisting of ions of nickel, cobalt, copper, tin, lead and palladium is additionally added to the aqueous solution.

8. The method according to claim 1 or 2, wherein salts of at least one of the anions selected from the group consisting of [Au(CN)2]— and [Au(SO3)2]3— is used as the compounds containing gold(I) ions, and salts of at least one of the anions selected from the group consisting of [AuX4]— and AuX3, where X=F, Cl, Br, I or CN is used as the compounds containing gold(III) ions.

* * * * *